(12) United States Patent
Yu et al.

(10) Patent No.: US 9,774,411 B2
(45) Date of Patent: Sep. 26, 2017

(54) CROSS-TALK CANCELLATION IN A MULTIBAND TRANSCEIVER

(71) Applicant: Alcatel Lucent, Boulogne Billancourt (FR)

(72) Inventors: Xin Yu, Stuttgart (DE); Thomas Bohn, Stuttgart (DE); Heinz Schlesinger, Stuttgart (DE)

(73) Assignee: Alcatel Lucent, Boulogne-Billancourt (FR)

( * ) Notice: Subject to any disclaimer, the term of this patent is extended or adjusted under 35 U.S.C. 154(b) by 409 days.

(21) Appl. No.: 14/394,698

(22) PCT Filed: Feb. 26, 2013

(86) PCT No.: PCT/EP2013/053755
§ 371 (c)(1),
(2) Date: Oct. 15, 2014

(87) PCT Pub. No.: WO2013/156189
PCT Pub. Date: Oct. 24, 2013

(65) Prior Publication Data
US 2015/0085634 A1    Mar. 26, 2015

(30) Foreign Application Priority Data

Apr. 16, 2012   (EP) .................................... 12305447

(51) Int. Cl.
| | |
|---|---|
| *H04J 1/12* | (2006.01) |
| *H04B 1/00* | (2006.01) |
| *H04B 1/04* | (2006.01) |
| *H04L 25/02* | (2006.01) |

(52) U.S. Cl.
CPC ................ *H04J 1/12* (2013.01); *H04B 1/005* (2013.01); *H04B 1/0475* (2013.01);
(Continued)

(58) Field of Classification Search
CPC ........ H04J 1/12; H04L 25/0204; H04B 1/005; H04B 1/0483; H04B 1/0475; H04B 2001/0425
See application file for complete search history.

(56) References Cited

U.S. PATENT DOCUMENTS

| | | | |
|---|---|---|---|
| 6,993,314 B2 * | 1/2006 | Lim ........................ | H03L 7/085 327/156 |
| 6,996,197 B2 | 2/2006 | Thomas et al. | |

(Continued)

FOREIGN PATENT DOCUMENTS

| | | |
|---|---|---|
| CN | 1799206 A | 7/2006 |
| JP | H 0420019 A | 1/1992 |

(Continued)

OTHER PUBLICATIONS

International Search Report for PCT/EP2013/053755 dated May 10, 2013.

*Primary Examiner* — Afshawn Towfighi
(74) *Attorney, Agent, or Firm* — Fay Sharpe, LLP

(57) ABSTRACT

Embodiments relate to a multiband transceiver apparatus (100), comprising a first transmit path (110) operable to transmit a first transmit signal (sig1) in a first radio frequency band ($RF_1$), wherein the first transmit path (110) comprises an input (112), an output (114) and a first feedback path (116) from the output towards the input of the first transmit path, a second transmit path (130) operable to transmit a second signal (sig2) in a second radio frequency band ($RF_2$), the second radio frequency band ($RF_2$) being different from the first radio frequency band ($RF_1$), wherein the second transmit path (130) comprises an input (132), an output (134) and a second feedback path (136) from the output towards the input of the second transmit path, and a cross-talk canceller (150) operable to cancel cross-talk from the second feedback path (136) to the first feedback path (Continued)

(116) and/or to cancel cross-talk from the first feedback path (116) to the second feedback path (136) of the multiband transceiver apparatus (100).

14 Claims, 4 Drawing Sheets

(52) U.S. Cl.
CPC ....... *H04B 1/0483* (2013.01); *H04L 25/0204* (2013.01); *H04B 2001/0425* (2013.01)

(56) References Cited

U.S. PATENT DOCUMENTS

| | | |
|---|---|---|
| 7,123,591 B1 | 10/2006 | Ostertag et al. |
| 7,388,904 B2 | 6/2008 | Raghavan et al. |
| 2009/0111399 A1* | 4/2009 | Norris .................. H03F 1/3247 455/114.3 |
| 2010/0227570 A1* | 9/2010 | Hendin .................. H04B 1/006 455/78 |
| 2010/0231462 A1* | 9/2010 | Tran ....................... H01Q 1/243 343/702 |
| 2012/0083229 A1 | 4/2012 | Kenington |

FOREIGN PATENT DOCUMENTS

| | | |
|---|---|---|
| JP | 2001-352261 A | 12/2001 |
| KR | 2002-0001750 A | 1/2002 |
| KR | 2002-0001750 A | 7/2003 |
| KR | 2006-0040747 A | 5/2006 |
| KR | 2008-0050974 A | 6/2008 |
| WO | WO 2011/098861 A1 | 8/2011 |

* cited by examiner

CROSS-TALK CANCELLATION IN A MULTIBAND TRANSCEIVER

Embodiments of the present invention generally relate to wireless communications and, in particular, to the cancellation of cross-talk between different transceiver paths in multiband transceivers.

BACKGROUND

Wireless networks are steadily growing and an increasing number of systems for mobile communications are deployed. For example, multiple standards of wireless cellular systems have been developed and introduced to the mass markets. While legacy $2^{nd}$ generation cellular communication systems, like e.g. GSM (Global System for Mobile Communications), have been mainly introduced to meet traditional demands for circuit switched voice communications with comparatively low data rates, $3^{nd}$ and $4^{th}$ generation mobile communication systems, like e.g. UMTS (Universal Mobile Telecommunication System) and LTE (Long-Term Evolution), are getting increasingly complex to meet the ever increasing demands for higher and higher data rates needed for packet based mobile communications. Typically, different wireless communication systems of different generations employ different non-overlapping Radio Frequency (RF) bands, namely radio spectra, for communicating between different transceiver devices of the respective wireless communication system.

Recently, a demand for so-called multiband transceivers, e.g. multiband base stations, calls more and more attention by communication system providers. Thereby a multiband transceiver may be understood as a transceiver which is capable of transmitting and/or receiving RF signals in different spectral RF bands, preferably at the same time, i.e. simultaneously. The different RF signals may either belong to one communication system standard, i.e. they may all be compliant to the same wireless communication system. However, different RF signals transmitted by a multiband transceiver may additionally even belong to different communications standards, i.e. different transmitted or received signals may be compliant to the different wireless communication systems. Such multiband capable transceivers, which may simultaneously transmit/receive different signals in different RF bands, where the signals themselves may belong to different standards, are one of the most challenging issues for modern multiband base stations.

Physical implementations RF transmitters suffer from a number of impairments that degrade the quality of a received signal beyond the impact of fading or thermal-noise at a distant receiver. Analog components in one or a plurality of transmit chains, which will also be referred to as transmitter paths in the sequel, typically cause various impairments because of their imperfect behavior. Most prominent non-idealities are carrier-frequency and sampling-rate offset, phase-noise, IQ-imbalance (I=In-phase signal component, Q=Quadrature signal component), and Power Amplifier (PA) nonlinearities. Especially the mixer after a Digital-to-Analog Converter (DAC), which is responsible for mixing a baseband (BB) signal with a carrier signal, may cause so called IQ imbalance imperfections. Beside the mixer, the PA is another source of impairments. The non-linear behavior of the PA characteristic close to the saturation point adds nonlinear distortions to the transmit signal, too. The nonlinearity of the PA mainly results in sideband emission and affects spectrum emission requirements. In the sequel, the combination of all those impairments of a transmitter path will also be referred to as transmit noise (TX noise). The transmit noise may be interpreted as a deviation of a physical, i.e. real-world RF transmit signal from an ideal transmit signal constellation due to the aforementioned transmitter non-idealities.

The impact of TX noise may be at least partially compensated by classical algorithms. Separate/different linearization and compensation algorithms, that are particularly designed to solve these problems, may compensate at least some of the aforementioned TX impairments more or less accurately (depending on the algorithm), e.g. using feedback signal and signal processing in the digital part of the transceiver chain. For example, at the transmitter TX noise may be at least partially compensated by means of (digital) pre-distortion for which a feedback path from the output towards the input of a TX path is required.

In case of a multiband transceiver, which comprises a plurality of transmit paths for different target frequency bands in one physical package or housing, the TX noise and/or the feedback signals of a TX path may negatively influence one or more neighboring/adjacent TX paths dedicated to other frequency bands. Due to this cross-talk between different TX paths belonging to different RF frequency bands or even belonging to different wireless communication standards, an appropriate compensation of transmitter impairments or TX noise in the individual TX paths gets more difficult. Hence, it is desirable to improve this unsatisfactory situation for multiband transceivers.

SUMMARY

It is one finding of the present invention that a multiband transceiver's neighboring or adjacent TX paths, including their respective feedback paths, may be closely spaced to each other, such that a signal cross-talk may take place from a first feedback path associated to a first TX path to a second feedback path associated to a second TX path. That is to say, the physical separation of two neighboring TX circuit paths, or their respective associated feedback paths, may not be large enough for a neglectable interference between the adjacent circuit paths. This may particularly be the case when two or more signal transceivers for different target RF bands are integrated into one common space-limited package or housing of the multiband transceiver, which cannot provide sufficient RF/IF path isolation (>40 dB), wherein IF abbreviates intermediate frequency. If the cross-talk or interference from the multiband transceiver's first TX path to the second TX path, and vice versa, is left uncompensated, the performance of the individual TX paths with respect to transmitter impairments or TX noise will deteriorate.

It is a further finding that the cross-talk between a multiband transceiver's interfering TX paths, or, to be more specific, their associated feedback paths, may be cancelled in order to improve the individual and/or the overall TX noise performance of the multiband transceiver's individual transceiver paths.

According to a first aspect embodiments of the present invention provide a multiband transceiver apparatus. Thereby the multiband transceiver apparatus may be coupled to or located in a multiband transceiver. That is to say, the multiband transceiver apparatus may be understood as an apparatus for a multiband transceiver. The multiband transceiver apparatus comprises a first transmit path or circuit which is operable to transmit a first transmit signal in a first radio frequency band. Thereby, the first transmit path comprises an input, an output and a first feedback path from the output towards the input of the first transmit path.

Further, the multiband transceiver apparatus comprises a second transmit path or circuit which is operable to transmit a second signal in a second radio frequency band, the second radio frequency band being different from the first radio frequency band. Also the second transmit path comprises an input, an output and a second feedback path from the output towards the input of the second transmit path. Moreover, the multiband transceiver apparatus comprises a cross-talk canceller which is operable to cancel cross-talk/interference from the second feedback path to the first feedback path and/or to cancel cross-talk from the first feedback path to the second feedback path of the multiband transceiver.

A transmit (TX) path may be understood as an (electrical) circuit or chain of various subsequently arranged digital and/or analog hardware components for translating a digital baseband signal to an analog RF signal, which may then be transmitted, via an antenna means, over the air interface to a distant receiver. Hence, one TX path in a multiband transceiver may, for example, comprise at least one digital or analog modulator, at least one Digital-to-Analog Converter (DAC), at least one mixer or up-converter for upconverting an analog baseband signal to the respective Radio Frequency (RF) band, and at least one Power Amplifier (PA). The other TX paths may comprise their own DACs, mixers and PAs or share these components with other TX paths. Of course, this component list may deviate for different embodiments of the present invention. During the translation of the digital baseband signal to the analog RF signal one or more hardware components of the TX path may distort the signal(s) travelling along the TX path. Such distortion (TX noise) may be due to imperfect and/or non-linear hardware behavior, as, for example, the nonlinear behavior of the PA.

Consequently, also a feedback path may be understood as an (electrical) circuit or chain of various digital and/or analog hardware components e.g. for translating a TX path's (distorted) RF signal back to the respective digital baseband domain for TX noise compensation purposes, such as digital predistortion, for example. Hence, a feedback path may, for example, comprise at least one mixer or down-converter for down-converting the analog RF signal to the baseband or an intermediate frequency band, at least one Analog-to-Digital Converter (ADC), and at least one demodulator. These components can also be shared with other feedback paths. Again, this component list is merely exemplary and may deviate for different embodiments of the present invention. According to some embodiments, the interfering signals of the feedback paths, i.e. the interfering feedback signals, may be located in the same or closely spaced (e.g. overlapping) frequency bands.

The individual transmit paths and/or their associated feedback paths of the multiband transceiver may physically be located in close vicinity to each other, such that non-neglectable cross-talk/interference from the first feedback path (or feedback circuitry) to the second feedback path may take place. For example, both the first and the second TX path, including their respective feedback paths, may be co-located on a common substrate, which may be a common Printed Circuit Board (PCB), for example, or may be co-located in a common housing, thus allowing cross-talk between different parts of the package. According to some embodiments, the first and the second TX path may even share common hardware components. Signal lines of the TX path circuitry carrying the respective first and second (TX) signals tend to radiate the carried TX signals, such that radiated TX or feedback signals may couple to neighboring or adjacent TX circuitry. Typically, such unwanted radiation will be rather weak, however, since the signal lines are not meant to work as antennas. However, if the TX paths associated to the different RF bands are spaced close enough and are not sufficiently shielded, a signal from a first feedback path may couple into a second feedback path, and vice versa, thereby leading to mutual interference. Due to such interference between neighboring feedback paths, TX noise compensation concepts relying on the respective feedback signals will deteriorate if the interference or cross-talk is not properly cancelled.

For this purpose, embodiments propose the cross-talk canceller, which may ideally free the signal of the first feedback path from unwanted signal components of the second feedback path and vice versa. The cross-talk cancellation may rely on known signal estimation and/or interference/cross-talk cancellation techniques, wherein transfer functions of the transmit paths and transfer functions between the first and the second feedback path may be estimated by means of well-known estimation techniques, such as Least Squares (LS) estimation, for example. Note that the first and second signals transmitted via the first and second TX path are or can be made known within the multiband transceiver.

According to some embodiments the multiband transceiver may be coupled to a (multiband) base station. That is to say, the base station may support a plurality of different, non-overlapping RF bands at the same time in order to support split spectrum applications or to support wireless communication systems operating in multiple RF bands, such as GSM-900 and GSM-1800/1900, the different operating frequency bands of UMTS and/or LTE. In some embodiments the multiband transceiver apparatus may even be operable to simultaneously transmit signals of different wireless communication system standards and/or different carrier frequencies simultaneously via the first and second TX path. Hence, the multiband transceiver may also be considered as a multi-standard transceiver, according to some embodiments. Thereby, the multiband transceiver may support one or more wireless communication systems, such as, for example, one or more of the wireless communication systems standardized by the $3^{rd}$ Generation Partnership Project (3GPP), as the Global System for Mobile Communications (GSM), Enhanced Data rates for GSM Evolution (EDGE), GSM/EDGE Radio Access Network (GERAN), Universal Terrestrial Radio Access Network (UTRAN) or Evolved UTRAN (EUTRAN), Long Term Evolution (LTE) or LTE-Advanced (LTE-A), or wireless communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. In the following the terms wireless communication system and mobile communication network may be used synonymously. Note that the concept of the present invention is not limited to the aforementioned wireless communication systems but is also applicable to other as well as future wireless communication system standards.

A multiband base station can be located in the fixed or stationary part of the network or system. A base station may correspond to a remote radio head, a transmission point, an access point, a macro cell, a small cell, a micro cell, a femto cell, a metro cell etc. A base station can be a wireless interface of a wired network, which enables transmission of radio signals in different RF bands to an associated UE or mobile terminal. Such a radio signal may comply with radio signals as, for example, standardized by 3GPP or, generally, in line with one or more of the above listed systems. Thus, a base station may correspond to a NodeB, an eNodeB, a BTS, an access point, etc.

In embodiments, the wireless communication system may comprise mobile terminals and base stations. Depending on the scenario, i.e. downlink or uplink, either one may function as a transmitter or receiver, respectively. For downlink, a base station will take over transmitter functionalities while a mobile terminal takes the receiver part. In the uplink it is vice versa, i.e., a base station works as a receiver while a mobile terminal works as a transmitter. Although the present invention will be described with reference to a multiband base station, other embodiments to not preclude (but may include) a multiband transceiver apparatus coupled to or located in a mobile terminal, wherein a mobile terminal may correspond to a smartphone, a cell phone, user equipment, a laptop, a notebook, a personal computer, a Personal Digital Assistant (PDA), a Universal Serial Bus (USB)-stick, a car, etc. As mentioned before, a mobile terminal may also be referred to as User Equipment (UE) in line with the 3GPP terminology. Further, the multiband transceiver apparatus may also be coupled to a relay station for relaying wireless signals from a base station to a mobile terminal, and vice versa.

According to yet a further aspect of the present invention it is provided a method for operating a multiband transceiver. The method comprises a step of transmitting, via a first transmit path of the multiband transceiver, a first transmit signal in a first radio frequency band, wherein the first transmit path comprises an input, an output and a first feedback path from the output towards the input of the first transmit path. The method comprises a second step of transmitting, via a second transmit path of the multiband transceiver, a second signal in a second radio frequency band, the second radio frequency band being different from the first radio frequency band, wherein the second transmit path comprises an input, an output and a second feedback path from the output towards the input of the second transmit path. Further, the method comprises a step of cancelling cross-talk or interference from the second feedback path to the first feedback path and/or cancelling cross-talk from the first feedback path to the second feedback path of the multiband transceiver.

Some embodiments comprise a digital control circuit installed within the apparatus for performing the method, i.e. the multiband transceiver apparatus. Such a digital control circuit, e.g. a digital signal processor (DSP), an Application Specific Integrated Circuit (ASIC), or the like, needs to be programmed accordingly. Hence, yet further embodiments also provide a computer program having a program code for performing embodiments of the method, when the computer program is executed on a computer, a digital processor or an integrated circuit.

Embodiments of the present invention may cancel cross-talk effects significantly if implemented properly. Generally, embodiments may enable a tight packaging of multiband transceivers, in which the received and feedback signal are located at the same frequency band or the frequency bands close to each other.

BRIEF DESCRIPTION OF THE FIGURES

Some embodiments of apparatuses and/or methods will be described in the following by way of example only, and with reference to the accompanying figures, in which.

DESCRIPTION OF EMBODIMENTS

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
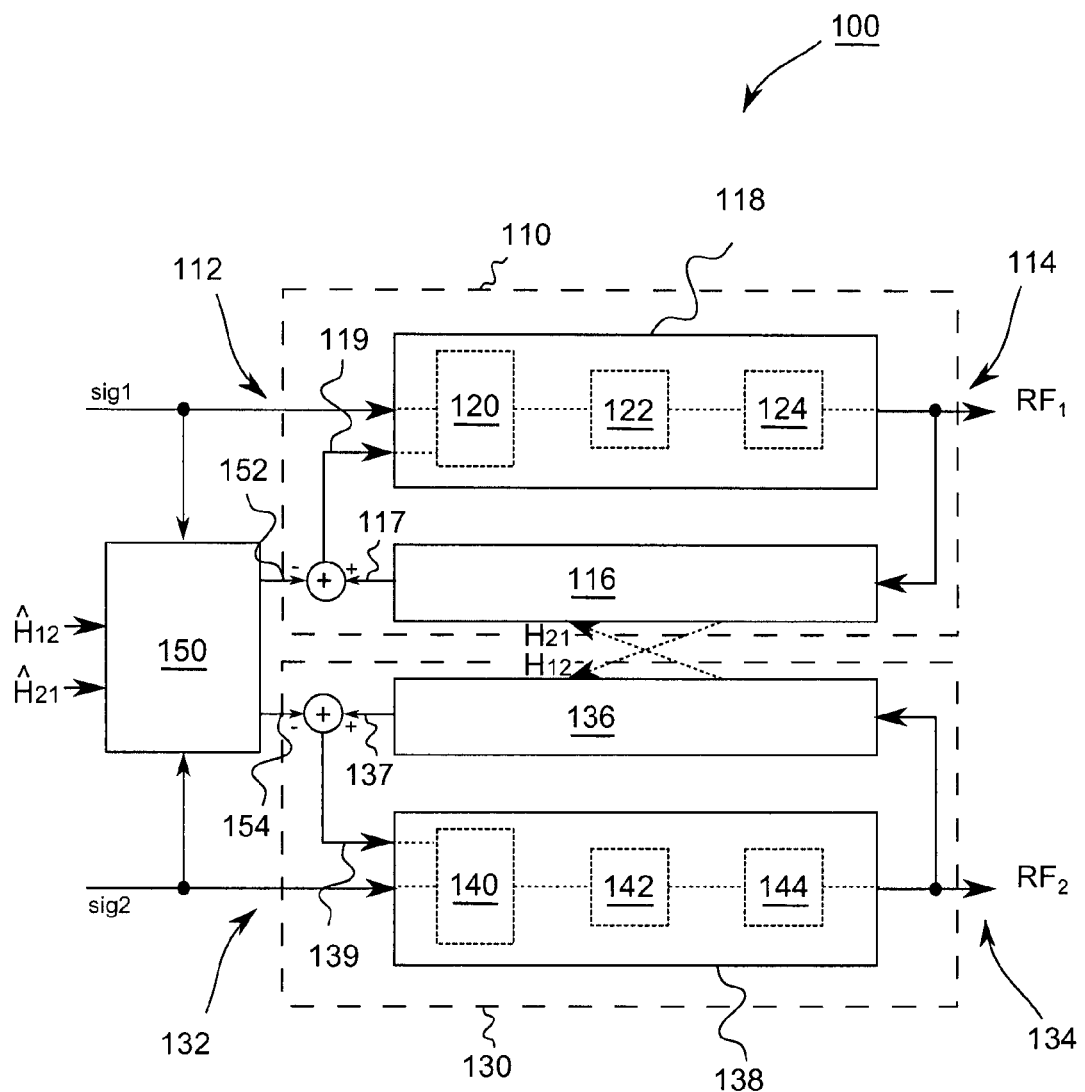
FIG. 1 shows a schematic block diagram of a multiband transceiver apparatus with cross-talk cancellation, according to an embodiment.

FIG. 1 shows a block diagram of an exemplary embodiment of a multiband transceiver apparatus 100. For example, the multiband transceiver apparatus 100 may be coupled to a base station of a wireless communication system, thus rendering the base station a multiband base station. Although the multiband transceiver apparatus 100 may additionally comprise receiver circuitry and receiver functionality, embodiments of the present invention will be explained referring to transmitter functionality or transmitter circuitry of apparatus 100.

The multiband transceiver apparatus 100 comprises a first transmit path (or chain) 110, which is adapted or operable to transmit a first transmit signal sig1 in a first radio frequency band $RF_1$. The first transmit path 110 of the multiband transceiver apparatus 100 comprises an input 112, an output 114 and a first feedback path 116 from the output 114 towards the input 112 of the first transmit path 110. The multiband transceiver apparatus 100 further comprises a second transmit path 130, which is adapted or configured to transmit a second signal sig2 in a second radio frequency band $RF_2$, wherein the second radio frequency band $RF_2$ is different from the first radio frequency band $RF_1$. According to embodiments the two radio frequency bands $RF_1$ and $RF_2$ are non-overlapping. Also, the second transmit path 130 comprises an input 132, an output 134 and a second feedback path 136 from the output 134 towards the input 132 of the second transmit path 130. Note that the inputs 112, 132 and the outputs 114, 134 are non-fixed points of the transmit paths 110, 130 and may be chosen dependent on a hardware setup of the multiband transceiver apparatus 100, for example. Therefore, if applicable, the inputs and outputs may also be chosen to lie somewhere else than depicted in FIG. 1. The multiband transceiver apparatus 100 further comprises cross-talk canceller circuitry 150 which is operable to cancel cross-talk from the second feedback path 136 to the first feedback path 116 and/or to cancel cross-talk from the first feedback path 116 to the second feedback path 136 of the multiband transceiver 100. That is to say, the cross-talk canceller circuitry 150 may be capable of cancelling mutual cross-talk between the interfering feedback paths or channels 116, 136.

According to embodiments the multiband transceiver apparatus 100 may be adapted to simultaneously transmit the signals sig1, sig2 in the different, preferably non-overlapping, radio frequency bands $RF_1$ and $RF_2$. In other words, the first transmit path 110 and the second transmit path 130 may be adapted or operable to transmit the first signal sig1 and the second signal sig2 in their respective radio frequency bands $RF_1$ and $RF_2$ at the same time, i.e. simultaneously.

As can be seen from FIG. 1, the cross-talk/interference from the first feedback path 116 to the second feedback path 136 may be modeled by a first cross-talk transfer function $H_{12}$, while the cross-talk from the second feedback path 136 to the first feedback path 116 may be modeled by a second cross-talk transfer function $H_{21}$. The behavior of the first TX path 110 (including the first feedback path 116) may be modeled by a first TX path transfer function $H_{11}$. Likewise the behavior of the second TX path 130 (including the second feedback path 136) may be modeled by a second TX path transfer function $H_{22}$. Note that all transfer functions may be frequency dependent. Since the two input signals sig1 and sig2 are or may be made known to the cross-talk canceller 150, the cross-talk transfer functions $H_{12}$ and $H_{21}$ may be estimated or measured in order to obtain estimated cross-talk transfer functions $\hat{H}_{12}$ and $\hat{H}_{21}$. Also, the TX path transfer functions $H_{11}$, $H_{22}$ may be estimated or measured by well-known methods. There are several well-known estimation methods that can be used to determine the mentioned transfer functions. For example, the well-known Least Squares (LS) estimation method may be employed.

The first transmit path 110 comprises, beside the feedback path 116, a feed-forward path 118. This feed-forward path 118 may comprise a sequence or chain of a plurality of subsequently arranged hardware components such as, for example, digital predistortion circuitry 120, at least one Digital-to-Analogue Converter (DAC) 122 and a circuit block 124 comprising modulation, up-conversion and/or power amplification (PA) circuitry. In particular, the hardware components of block 124 have non-ideal, nonlinear behavior and therefore introduce transmitter impairments (TX noise) such as I/Q-imbalance and/or nonlinear distortion, to the first signal sig1. In order to compensate for the TX noise, the feedback path 116 may receive the first RF signal $RF_1$, down-convert it to an intermediate frequency band or to the baseband domain in order to obtain a first feedback signal 117. However, the first feedback first signal 117 is impaired by cross-talk from the second feedback path 136. For this purpose a first compensation signal 152 from the cross-talk canceller 150 may be subtracted from the first fed back signal 117 to obtain a first cross-talk cancelled feedback signal 119, which may be used for digital predistortion in block 120. The first feedback path 116 may be used for mitigating TX noise in the first RF signal $RF_1$ due to I/Q-imbalance and/or PA nonlinearities, for example. For this purpose, the first feedback path 116 may comprise hardware circuitry, such as down-conversion circuitry and Analogue-to-Digital Converters (ADC) in order to feed the distorted signal $RF_1$ back from the output 114 towards the input 112 of the first TX path 110. Together with the original first signal sig1 digital predistortion concepts or other signal processing may be applied for mitigating or compensating the unwanted TX noise of the first TX path 110.

Likewise, the second transmit path 130 comprises, beside the second feedback path 136, a second feed-forward path 138. This feed-forward path 138 may also comprise a sequence or chain of a plurality of subsequently arranged hardware components such as, for example, digital predistortion circuitry 140, at least one Digital-to-Analogue Converter (DAC) 142 and a circuit block 144 comprising modulation, up-conversion and/or power amplification (PA) circuitry. In particular, the hardware components of block 144 have non-ideal, nonlinear behavior and therefore introduce transmitter impairments (TX noise) such as I/Q-imbalance and/or nonlinear distortion, to the second signal sig2. In order to compensate for the TX noise the feedback path 136 may receive the second RF signal $RF_2$, down-convert it to an intermediate frequency band or to baseband domain in order to obtain a second feedback signal 137. However, the second feedback signal 137 is impaired by cross-talk from the first feedback path 116. For this purpose a second compensation signal 154 from the cross-talk canceller 150 may be subtracted from the second feedback signal 137 to obtain a second cross-talk cancelled feedback signal 139, which may be used for digital predistortion in block 140. Hence, the second feedback path 136 may be used for mitigating TX noise in the second RF signal $RF_2$ due to I/Q-imbalance and/or PA nonlinearities, for example. For this purpose, also the second feedback path 136 may comprise hardware circuitry, such as down-conversion circuitry and ADCs in order to feed the distorted signal $RF_2$ back from the output 134 towards the input 132 of the second TX path 130. Together with the non-distorted second signal sig2 digital predistortion concepts or other signal processing may be applied for mitigating or compensating the unwanted TX noise of the second TX path 130.

Embodiments of the present invention may address multiband transceivers with co-located first and second transmit paths 110 and 130. That is to say, multiband transceivers may be considered where the first transmit path 110 and the second transmit path 130, including the respective feedback paths 116 and 136, are located in such vicinity to each other that non-neglectable cross-talk from the first feedback path 116 into the second feedback path 136, and vice-versa, can take place. This may, for example, happen when both transmit paths 110 and 130 are co-located on a common substrate, such as a common PCB, or if they are located within a common housing of the multiband transceiver apparatus 100. In some embodiments the two TX paths 110, 130 may even share one or more common hardware components, e.g. a power amplifier. Due to the space limitation in such a multiband transceiver package, one may face undesired cross-talk in the feedback paths 116 and 136. As has been explained before, the feedback paths 116 and/or 136 may be used to measure analogue behavior like PA gain, PA nonlinearity, local oscillator leakage, I/Q-imbalance, etc.

In some particular embodiments the multiband transceiver apparatus 100 may not only be able to simultaneously transmit different signals sig1, sig2 in different and distant RF bands, but the multiband transceiver apparatus 100 may also be able to simultaneously transmit different signals of different wireless communication system standards. This means that the first signal sig1 and/or $RF_1$ may be compliant to a first wireless communication system, while the second signal sig2 and/or $RF_2$ may be compliant to a second wireless communication system being different from the first wireless communication system related to the first signal. For example, the first wireless communication system may be a CDMA-based communication system, like UMTS, while the second wireless communication system may be an OFDMA-based communication system, like LTE, for example. Note, however, that the present invention is not limited to such wireless communication systems.

Figure 2A:
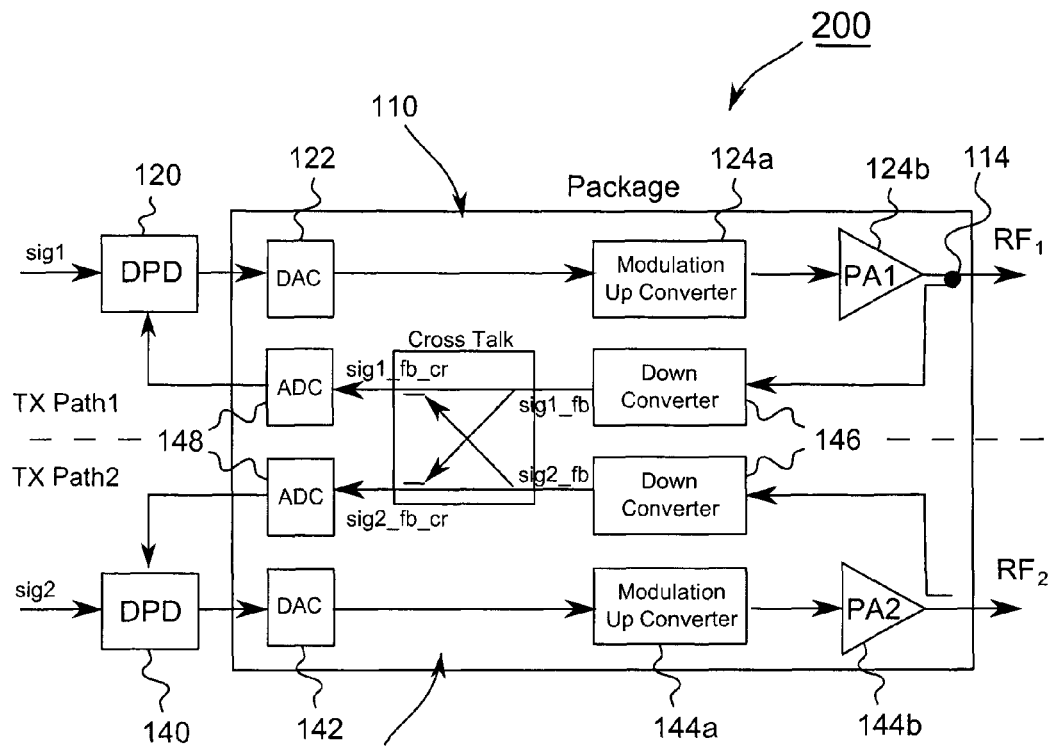
FIG. 2a shows an integration of two transmitters in one multiband transceiver package, according to an embodiment.

Turning now to FIG. 2a, which is showing a more detailed view of the feed-forward paths 118, 138 and the feedback paths 116, 136, the cross-talk cancellation according to an embodiment of the present invention will be explained in more detail.

FIG. 2a shows a first transmit path 110 and a second transmit path 130 integrated into a joint RF/IF/BB module 200. As can be seen, the first transmit path 110 comprises a first transmit predistorter 120. Input to the first predistorter 120 is a first undistorted digital baseband signal sig1 and a fed back version of the first signal. In the illustrated embodiment the input signal sig1 of the first predistorter 120 (or an input thereof) indicates the input 112 of the first transmit path 110. That is to say, the first transmit path 110 may comprise a first transmit predistorter 120 operable to determine a first predistorted transmit signal based on the first signal sig1 and a first feedback signal sig1_fb_cr of the first transmit path 110. The output of the digital predistortion network 120 is coupled to a DAC 122 for digital-to-analogue conversion. The output of the DAC 122 is coupled to a modulation and up-conversion block 124a, where the analogue baseband signal is modulated in accordance with a certain modulation scheme and/or up-converted from the baseband domain to the RF transmission band $RF_1$. The output of block 124a is coupled to a first power amplifier PA1 124b for amplifying the first analogue transmit signal of the first transmit path 110. In the illustrated embodiment the output of the power amplifier 124b forms the output 114 of the first transmit path 110. This output, i.e. the amplified first RF signal $RF_1$, is used as an input for the first feedback path 116 comprising a down-converter 146 and an ADC 148 according to the depicted exemplary embodiment. The fed back first RF signal $RF_1$ is mixed or down-converted to the baseband domain or an intermediate frequency below the first RF band $RF_1$ by the down-converter 146 to obtain a down-converted first signal sig1_fb.

Likewise, the second transmit path 130 comprises a second transmit predistorter 140. Input to the second predistorter 140 is a second undistorted digital baseband signal sig2 and a fed back version of the second signal. In the illustrated embodiment the input signal sig2 of the second predistorter 140 denotes the input 132 of the second transmit path 130. That is to say, the second transmit path 130 may comprise a second transmit predistorter 140 operable to determine a second pre-distorted transmit signal based on the second signal sig2 and a second feedback signal sig2_fb_cr of the second transmit path 136. The output of the second digital predistortion network 140 is coupled to a DAC 142 for digital-to-analogue conversion. The output of the DAC 142 is coupled to a modulation and up-conversion block 144a, where the analogue baseband signal is modulated in accordance with a certain modulation scheme and/or up-converted from the baseband domain to the RF transmission band $RF_2$. The output of block 144a is coupled to a second power amplifier PA2 144b for amplifying the second analogue transmit signal of the second transmit path 130. In the illustrated embodiment the output of the second power amplifier 144b forms the output 134 of the second transmit path. This output, i.e. the amplified second RF signal $RF_2$, is used as an input for the second feedback path 136 also comprising a down-converter 146 and an ADC 148 according to the illustrated exemplary embodiment. The fed back second RF signal $RF_2$ is mixed or down-converted to the baseband domain or an intermediate frequency below the second RF band $RF_2$ by the down-converter 146 to obtain a down-converted second signal sig2_fb.

Figure 2B:
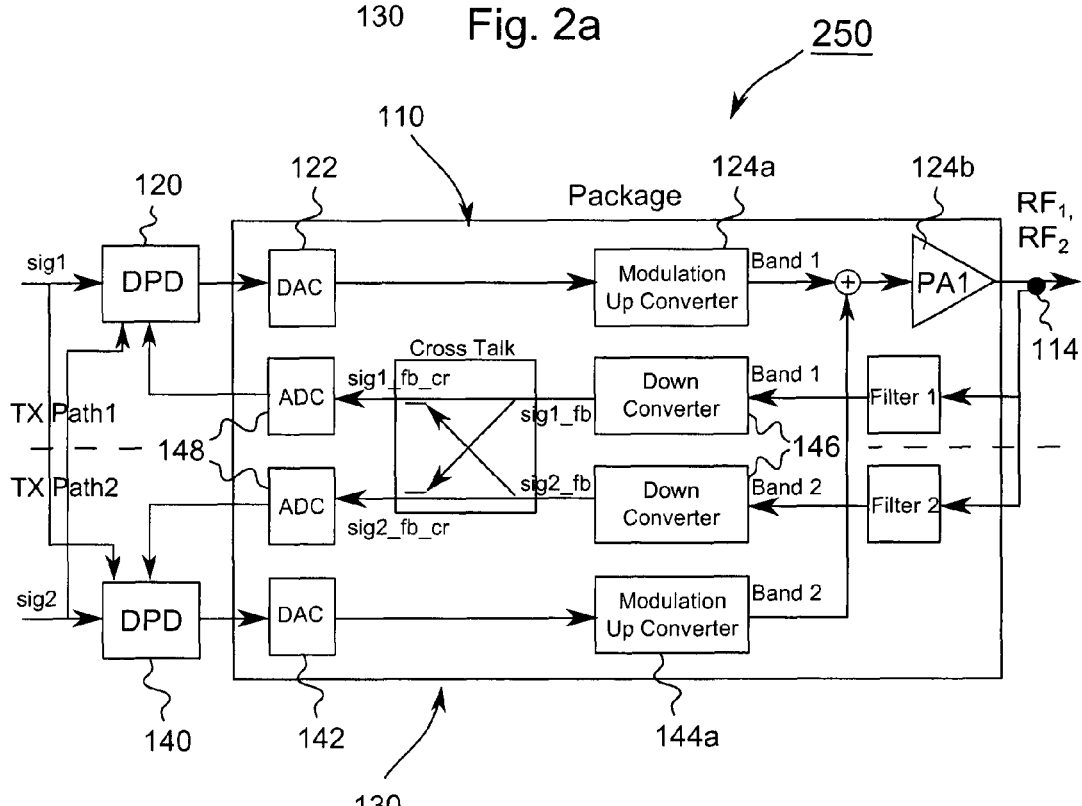
FIG. 2b shows an integration of two transmitters in one multiband transceiver package, according to a further embodiment.

A further embodiment of a joint RF/IF/BB module 250 is illustrated in FIG. 2b, which differs from FIG. 2a in that both transmit paths 110 and 130 share a common power amplifier 124b for both RF transmission bands $RF_1$ and $RF_2$. That is to say, in this case the output 114 carries both the first and the second RF signals $RF_1$ and $RF_2$. For this reason the two feedback branches 116 and 136 both comprise filters (Filter1, Filter2) to filter out the respective unwanted RF signals, i.e. $RF_2$ is filtered out by Filter1 and $RF_1$ is filtered out by Filter2.

According to embodiments, the first and the second feedback paths 116, 136 are both co-located in a common transceiver housing and/or on a common transceiver PCB, such that a signal of the first feedback path 116 may couple to the second feedback path 136 and vice versa. Due to said cross-talk from the second feedback path 136 carrying the second down-converted feedback signal sig2_fb, the first down-converted feedback signal sig1_fb of the first feedback path 116 is impaired. The impaired first feedback signal sig1_fb_cr may be modeled by $$sig1\_fb\_cr[n]=sig1\_fb[n]+H_{21}[n]*sig2\_fb[n], \quad (1)$$

wherein $H_{21}[n]$ denotes the second cross-talk transfer function in the discrete time domain and * denotes the convolution operator.

Likewise, the second impaired feedback signal sig2_fb_cr may be modeled by $$sig2\_fb\_cr[n]=sig2\_fb[n]+H_{12}[n]*sig1\_fb[n], \quad (2)$$

wherein $H_{12}[n]$ denotes the first cross-talk transfer function in the discrete time domain.

The down-converted feedback signals sig1_fb, sig2_fb (or sig1_fb_cr, sig2_fb_cr) may be located at the same frequency or at least at least frequencies close to each other. That is to say, the down-converted feedback signals of both feedback paths may lie in equal or similar and potentially overlapping frequency regions. Therefore, the cross-talk effects due to the close interspacing between the first and the second feedback paths 116, 136 may not easily be removed by spectral filtering. As a result, the defective feedback signals sig1_fb_cr, sig2_fb_cr may cause higher bit error rates, decreased performance of the TX noise-related signal processing (e.g. digital predistortion) in the multiband transceiver 100 and additionally falsify measurements. Therefore, the cross-talk effects in both feedback signal paths 116 and 136 should be compensated or cancelled for a proper operation of the entire multiband transceiver 100. One idea may be to use signal processing in the digital baseband domain to determine or calculate the cross-talk effects. This is possible since both of the source signals sig1 and sig2 are known within the multiband transceiver apparatus 100. Hence, the cross-talk effects can be complementarily subtracted from the defective feedback signals 117, 137, which has already been explained with reference to FIG. 1.

Figure 3A:
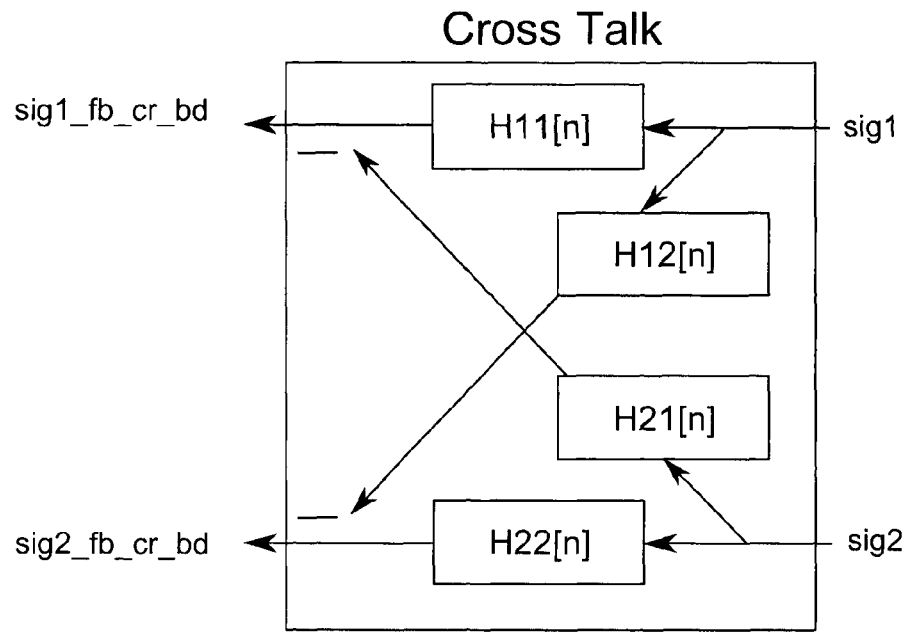
FIG. 3a depicts a cross-talk baseband model.
Figure 3B:
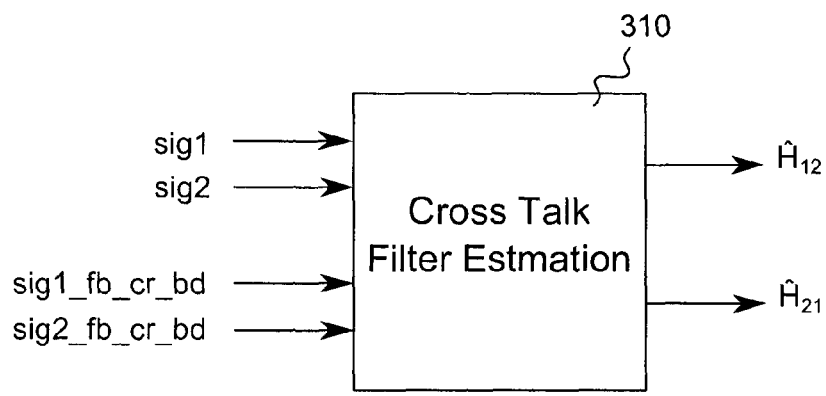
FIG. 3b shows a block diagram of a cross-talk estimator, according to an embodiment.
Figure 3C:
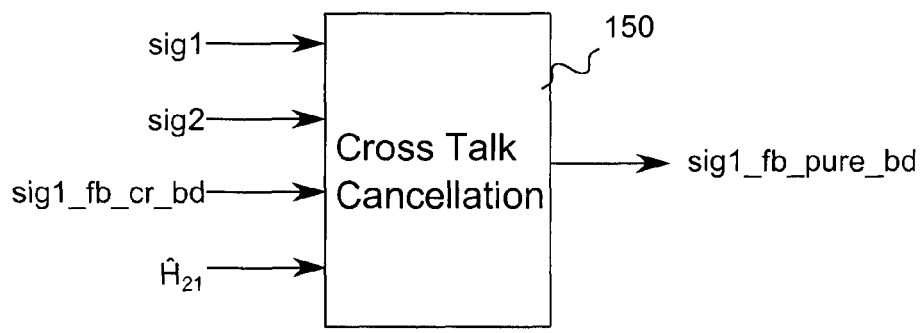
FIG. 3c depicts a cross-talk cancellation block, according to an embodiment.

The baseband model including the cross-talk effects between the two feedback paths 116 and 136 is depicted in FIG. 3a. As can be seen from FIG. 3a, the cross-talk from the first feedback path to the second feedback path may be modeled by at least one first complex-valued cross-talk FIR filter $H_{12}$, while the cross-talk from the second feedback path to the first feedback path may be modeled by at least one second cross-talk complex-valued FIR filter $H_{21}$. The behavior of the first TX path (including the first feedback path) may be modeled by at least one first complex-valued TX path FIR filter $H_{11}$. Likewise the behavior of the second TX path (including the second feedback path) may be modeled by at least one second complex-valued TX path FIR filter $H_{22}$. Thereby, the two cross-talk FIR filters $H_{12}$ and $H_{21}$ describe the coupling effects from the first signal feedback path 116 to the second signal feedback path 136 and vice-versa. The two TX path FIR filters $H_{11}$ and $H_{22}$ describe a transfer function of the whole first transmit path 110 (including the non-interfered first feedback path) and the whole second transmit path 130 (including the non-interfered second feedback path), respectively. Hence, the transfer functions $H_{11}$ and $H_{22}$ include both the transfer functions of the feed-forward paths 118 and 138 and the feedback paths 116, 136, respectively. The goal of the cross-talk canceller 150, also shown in FIG. 3c, is to remove the cross-talk error signals $H_{21}[n]*sig2\_fb[n]$ and $H_{12}[n]*sig1\_fb[n]$ from the defective feedback signals, $$sig1\_fb\_cr\_bd[n]=H_{11}[n]*sig1[n]+H_{21}[n]*sig2[n], \text{ and} \quad (3)$$

$$sig2\_fb\_cr\_bd[n]=H_{22}[n]*sig1[n]+H_{12}[n]*sig2[n]. \quad (4)$$

According to embodiments the cross-talk canceller 150 (see FIG. 3c) may be adapted to estimate filter coefficients of the at least one first and/or the at least one second cross-talk filter to obtain the aforementioned at least one first and/or the at least one second estimated cross-talk filter $\hat{H}_{12}$ and $\hat{H}_{21}$. For this purpose the cross-talk canceller 150 may comprise or be coupled to a cross-talk filter estimator 310, which may be adapted to estimate $\hat{H}_{12}$ and/or $\hat{H}_{21}$ based on sig1, sig1_fb_cr_bd, sig2, and/or sig2_fb_cr_bd (see FIG. 3b). Thereby, the estimated cross-talk filters $\hat{H}_{12}$ and $\hat{H}_{21}$ may be obtained by various well-known estimation techniques such as LS estimation, for example. Note that the signals sig1_fb_cr_bd, sig2_fb_cr_bd, sig1 and sig2 may be made known within the multiband transceiver apparatus 100. That is to say, by means of the LS estimation method or other estimation methods, one can calculate or determine estimates of the functions $H_{11}$, $H_{21}$ and $H_{22}$, $H_{12}$. Another estimation method for obtaining the transfer functions $H_{11}$, $H_{21}$ and $H_{22}$, $H_{12}$ would be to let the individual transmit paths 110, 130 run subsequently and independently from each other. That is to say, one could switch on the first transmit path 110 while switching off the second transmit path 130. In this way one could determine the transfer functions $H_{11}$ and $H_{12}$. In a subsequent step, one could switch on the second transmit path 130 while switching off the first transmit path 110. In this way, one could measure the transfer functions $H_{22}$ and $H_{21}$.

After having estimated the required transfer functions it is possible to subtract the coupling effects from the feedback signal according to $$sig1\_fb\_pure\_bd[n]=sig1\_fb\_cr\_bd[n]-\hat{H}_{21}[n]*sig2[n], \text{ and} \quad (5)$$

$$sig2\_fb\_pure\_bd[n]=sig2\_fb\_cr\_bd[n]-\hat{H}_{12}[n]*sig1[n] \quad (6)$$

to obtain the first and second cross-talk cancelled feedback signals 119, 139 (i.e. sig1_fb_pure_bd, sig2_fb_pure_bd). In other words, the cross-talk canceller 150 may be adapted to subtract a filtered version of the second signal sig2 filtered with the at least one second estimated cross-talk filter $\hat{H}_{21}$ from the defective feedback signal sig1_fb_cr_bd in the first signal path 116 and/or to subtract a filtered version of the first signal sig1 filtered with the at least one first estimated cross-talk filter $\hat{H}_{12}$ from the defective feedback signal sig2_fb_cr_bd in the second signal path 136.

In order to verify embodiments of the present invention simulations have been performed. In one exemplary simulation bench one UMTS signal and one LTE signal with an exemplary bandwidth of 10 MHz were used as the signals sig1 and sig2, respectively. The operating band for the UMTS signal sig1 was chosen to be the frequency band around 2100 MHz, also commonly referred to as operating band I. The RF band for the LTE signal sig2 was chosen to be the RF band around 2600 MHz, also commonly referred to as operating band VII. Hence, the first RF band and the second RF band are different, non-overlapping RF bands separated by a plurality of 100 MHz (around 500 MHz in the present example). The transfer functions $H_{11}$ (=$H_{22}$) and $H_{21}$ (=$H_{12}$) have each been modeled with three-tab FIR filters defined as:

$$H_{11}=[0.86+0.27j\ 0.13+0.07j\ 0.08+0.04j], \quad (7)$$

and $$H_{21}=[0\ 0.08\ 0.02+0.015j\ 0.01+0.003j]. \quad (8)$$

Figure 4:
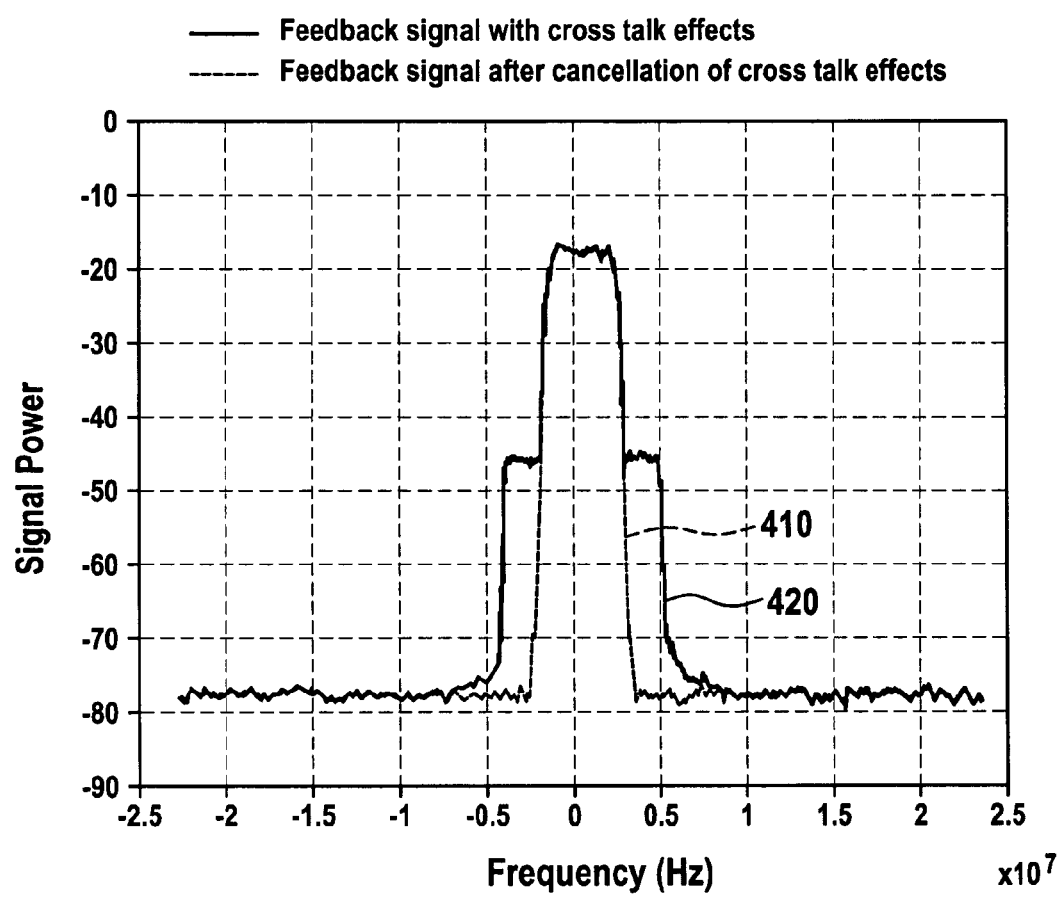
FIG. 4 illustrates the performance of the cross-talk cancellation according to an embodiment.

Turning now to FIG. 4, one can clearly observe that the quality of the signal spectrum after cross-talk cancellation (see reference numeral 410) is much better than the quality of the signal spectrum without cross-talk cancellation (see reference numeral 420). The cross-talk coupling effects originating from the second transmit path carrying the LTE signal (sig2) may be completely cancelled. The interfering LTE signal disappears under the noise level (as depicted in FIG. 4). Therefore, the UMTS feedback signal after cross-talk cancellation (sig1_fb_pure_bd) is free of any coupling effect from the interfering second signal path carrying the LTE signal (sig2). As it will be apparent to the skilled person, embodiments of the present invention may also well be extended to multiband transceivers capable of handling more than only two different and distinct RF bands.

Generally, the two PAs 124b and 144b will introduce nonlinearities into the related first and second signal paths 110 and 130, respectively. These nonlinearities may result in higher-order signal components of the first signal sig1 and the second signal sig2 respectively. To account for those higher-order signal components the transfer functions $H_{11}$, $H_{21}$ and $H_{22}$, $H_{12}$ may, for example, be modeled by more complex filter structures, respectively. Mathematically spoken, each filter structure $H_{11}$, $H_{21}$ and $H_{22}$, $H_{12}$ may comprise a plurality of filters, wherein an n-th filter corresponds to the n-th power or order of the respective signal sig1 or sig2. For the first TX path 110 this can be expressed by $$\text{sig1\_fb\_cr\_bd}[n]=H11[n]*\text{sig1}[n]+H_{non12}[n]* \\ \text{sig1}[n]^2+H_{non13}[n]*\text{sig1}[n]^3\ldots+H21[n]*\text{sig2} \\ [n]+H_{non22}[n]*\text{sig2}[n]^2+H_{non23}[n]*\text{sig2}[n]^3 \quad (9)$$

wherein the (FIR) filters $H_{non22}$, $H_{non23}$ represent the cross-talk effects (from the second to the first TX path) for the nonlinear signal parts or order two and three, respectively. Or more generally, the elements $H_{11}$, $H_{21}$ and $H_{22}$, $H_{12}$ may comprise any functions (systems) such as nonlinear functions and/or linear time-invariant functions. For the second TX path 130 this can be expressed by $$\text{sig2\_fb\_cr\_bd}[n]=H22[n]*\text{sig2}[n]+H_{non22}[n]* \\ \text{sig2}[n]^2+H_{non23}[n]*\text{sig2}[n]^3\ldots+H12[n]*\text{sig1} \\ [n]+H_{non12}[n]*\text{sig1}[n]^2+H_{non13}[n]*\text{sig1}[n]^3 \quad (10)$$

wherein the (FIR) filters $H_{non12}$, $H_{non13}$ represent the cross-talk effects (from the first to the second TX path) for the nonlinear signal parts or order two and three, respectively.

Hence, the signal e.g. in the first feedback path after cross-talk cancellation may be expressed as $$\text{sig1\_fb\_pure\_bd}[n]=\text{sig1\_fb\_cr\_bd}[n]-H21[n]*\text{sig2} \\ [n]-H_{non22}[n]*\text{sig2}[n]^2-H_{non23}[n]*\text{sig2}[n]^3 \quad (11)$$

According to another embodiment, which enables to get rid of the nonlinearity effects of the PAs 124b and 144b, one may reduce the transmit power in a first step, such that the PAs 124b and 144b would therefore be operated in their linear region, respectively. In this way, the entire (multi-band) transceiver may be assumed to be linear and one may at first calculate or determine the (linear) cross-talk transfer functions $H_{12}$ and $H_{21}$ and then increase the transmit power again. After running the digital predistortion may means of the digital predistortion blocks 122 and 142, the nonlinearities of the PAs 124b and 144b may then be compensated and one may restart the adaptation of the cross-talk cancellation algorithm again. In other words, the cross-talk canceller 150 may, according to some embodiments, be adapted to initiate, for an initial cross-talk cancellation prior to a transmit predistortion for the first and/or the second transmit path 110, 130, a reduction of a transmit power of the first and/or the second transmit path 110, 130, such that a power amplifier 124b, 144b of the first and/or the second transmit path 110, 130 is operated in its linear region. Furthermore, the cross-talk canceller 150 may be adapted to initiate, after said initial cross-talk cancellation, an increase of the reduced transmit power to perform a further cross-talk cancellation based on the predistorted signals of the first and/or the second transmit path 110 and 130.

In both aforementioned ways, the nonlinearities of the power amplifiers 124b and 144b would be accounted for and would hence not deteriorate the cross-talk cancellation performance.

To summarize, embodiments of the present invention may provide an attractive and straightforward solution to mitigate cross-talk effects in transmit and/or feedback paths of a multiband transceiver, wherein the cross-talk effects may be due to the tight packaging of the individual transmit/feedback paths. If left uncompensated, the cross-talk effect may introduce a significant error, in particular in the feedback signal, which in return can cause unpredictable impacts in the multiband transceiver device. Ideally, embodiments may cancel the cross-talk effects by 100% in simulation. Therefore, embodiments may enable tighter packaging of multiband transceivers, in which the received and the feedback signal are located at the same frequency band or at frequency bands close to each other.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks may be provided through the use of dedicated hardware, as e.g. a processor, as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

The invention claimed is:

1. A multiband transceiver apparatus, comprising:
    a first transmit path operable to transmit a first transmit signal in a first radio frequency band, wherein the first transmit path comprises an input, an output, and a first up-converter operable to convert a first baseband transmit signal to a first up-converted transmit signal in the first radio frequency band and a first feedback path from the output towards the input of the first transmit path, wherein the first feedback path includes a first down-converter operable to convert the first up-converted transmit signal to a first down-converted signal in the baseband or in a first intermediate frequency band below the first radio frequency band;
    a second transmit path operable to transmit a second signal in a second radio frequency band, the second radio frequency band being different from the first radio frequency band, wherein the second transmit path comprises an input, an output, and a second up-converter operable to convert a second baseband transmit signal to a second up-converted transmit signal in the second radio frequency band, and a second feedback path from the output towards the input of the second transmit path, wherein the second feedback path includes a second down-converter operable to convert the second up-converted transmit signal to a second down-converted signal in the baseband or in a second intermediate frequency band below the second radio frequency band; and
    a cross-talk canceller operable to cancel cross-talk from the second feedback path to the first feedback path and/or to cancel cross-talk from the first feedback path to the second feedback path of the multiband transceiver apparatus.

2. The multiband transceiver apparatus according to claim 1, wherein the first transmit path and the second transmit path are operable to transmit the first signal and the second signal in their respective radio frequency bands simultaneously.

3. The multiband transceiver apparatus according to claim 1, wherein the first and the second feedback path are used to determine and/or to mitigate transmitter impairments of the first and the second transmit path, respectively, in particular transmitter impairments related to power amplifier non-linearity and/or IQ-imbalance in the respective transmit path.

4. The multiband transceiver apparatus according to claim 1, wherein the first transmit path comprises a first transmit predistorter operable to determine a first predistorted transmit signal based on the first and/or the second signal and a first feedback signal of the first transmit path, and wherein the second transmit path comprises a second transmit predistorter operable to determine a second predistorted transmit signal based on the second and/or the first signal and a second feedback signal of the second transmit path.

5. The multiband transceiver apparatus according to claim 1, wherein the first and the second feedback path are both co-located in a common transceiver housing and/or on a common transceiver printed circuit board, such that a signal of the first feedback path may couple to the second feedback path and vice versa.

6. The multiband transceiver apparatus according to claim 1, wherein the first signal is compliant to a first wireless communication system and wherein the second signal is compliant to a second wireless communication system being different from the first wireless communication system.

7. The multiband transceiver apparatus according to claim 6, wherein the first wireless communication system is a Code Division Multiple Access based system and wherein the second wireless communication system is an Orthogonal Frequency Division Multiple Access based system.

8. The multiband transceiver apparatus according to claim 1, wherein the first down-converted signal and the second down-converted signal are located in the same frequency range or in respective frequency ranges which are adjacent to each other.

9. The multiband transceiver apparatus according to claim 1, wherein the cross-talk from the first feedback path to the second feedback path is modeled by at least one first cross-talk filter, wherein the cross-talk from the second feedback path to the first feedback path is modeled by at least one second filter, and wherein the cross-talk canceller is operable to estimate filter coefficients of the at least one first and/or the at least one second cross-talk filter to obtain at least one first and/or at least one second estimated cross-talk filter.

10. The multiband transceiver apparatus according to claim 9, wherein the cross-talk from the first feedback path to the second feedback path is modeled by a filter structure for filtering the first and at least one higher order component of the first signal, and wherein the cross-talk from the second feedback path to the first feedback path is modeled by a filter structure for filtering the first and at least one higher order component of the second signal.

11. The multiband transceiver apparatus according to claim 9, wherein the cross-talk canceller is operable to subtract a filtered version of the second signal filtered with the at least one second estimated cross-talk filter from a signal in the first feedback path and/or to subtract a filtered version of the first signal filtered with the at least one first estimated cross-talk filter from a signal in the second feedback path.

12. The multiband transceiver apparatus according to claim 1, wherein the cross-talk canceller is operable to initiate, for an initial cross-talk cancellation prior to a transmit pre-distortion for the first and/or second transmit path, a reduction of a transmit power of the first and/or the second transmit path, such that a power amplifier of the first and/or the second transmit path is operated in its linear region, and wherein the cross-talk canceller is operable to initiate, after the initial cross-talk cancellation, an increase of the reduced transmit power to perform a further cross-talk cancellation based on predistorted signals.

13. A method for operating a multiband transceiver, comprising:
    transmitting, via a first transmit path, a first transmit signal in a first radio frequency band, wherein the first transmit path comprises an input, an output and a first up-converter operable to convert a first baseband transmit signal to a first up-converted transmit signal in the first radio frequency band, and a first feedback path from the output towards the input of the first transmit path, with a first down-converter operable to convert the first up-converted transmit signal to a first down-converted signal in the baseband or in a first intermediate frequency band below the first radio frequency band;
    transmitting, via a second transmit path, a second signal in a second radio frequency band, the second radio frequency band being different from the first radio frequency band, wherein the second transmit path comprises an input, an output, and a second up-converter operable to convert a second baseband transmit signal to a second up-converted transmit signal in the second radio frequency band and a second feedback path from the output towards the input of the second transmit path, with a second down-converter operable to convert the second up-converted transmit signal to a second down-converted signal in the baseband or in a second intermediate frequency band below the second radio frequency band; and
    cancelling cross-talk from the second feedback path to the first feedback path and/or to cancel cross-talk from the first feedback path to the second feedback path of the multiband transceiver.

14. A computer program having a program code for performing the method of claim 13, when the computer program is executed on a computer or processor.

* * * * *